(12) United States Patent
Iwafuji

(10) Patent No.: US 6,915,035 B2
(45) Date of Patent: Jul. 5, 2005

(54) VARIABLE WAVELENGTH OPTICAL TRANSMITTER OUTPUT CONTROL METHOD THEREFOR AND OPTICAL COMMUNICATION SYSTEM

(75) Inventor: Takami Iwafuji, Tokyo (JP)

(73) Assignee: NEC Corporation, Tokyo (JP)

( * ) Notice: Subject to any disclaimer, the term of this patent is extended or adjusted under 35 U.S.C. 154(b) by 548 days.

(21) Appl. No.: 10/012,412

(22) Filed: Dec. 12, 2001

(65) Prior Publication Data

US 2002/0071458 A1 Jun. 13, 2002

(30) Foreign Application Priority Data

Dec. 13, 2000 (JP) ........................................ 2000-378232

(51) Int. Cl.⁷ ............................................... G02B 6/28
(52) U.S. Cl. ........................ 385/24; 398/100; 398/115
(58) Field of Search ............................. 385/16, 24–27, 385/31–39; 398/100, 105, 115, 130

(56) References Cited

U.S. PATENT DOCUMENTS

| | | | | |
|---|---|---|---|---|
| 5,202,782 A | * | 4/1993 | Nakamura et al. ............ | 398/91 |
| 5,212,577 A | * | 5/1993 | Nakamura et al. ............ | 398/79 |
| 5,369,516 A | * | 11/1994 | Uchida ........................ | 398/60 |
| 5,546,483 A | * | 8/1996 | Inoue et al. ................... | 385/14 |
| 5,657,144 A | * | 8/1997 | Tanaka et al. ................ | 398/48 |
| 5,663,818 A | * | 9/1997 | Yamamoto et al. ........... | 398/58 |
| 5,715,075 A | * | 2/1998 | Tanaka et al. ................ | 398/48 |
| 5,859,718 A | * | 1/1999 | Yamamoto et al. ........... | 398/51 |
| 5,862,165 A | * | 1/1999 | Handa et al. ................. | 372/27 |
| 6,023,359 A | * | 2/2000 | Asahi ............................ | 398/5 |
| 6,081,632 A | * | 6/2000 | Yoshimura et al. ............ | 385/5 |
| 6,094,446 A | | 7/2000 | Tei et al. | |
| 6,160,931 A | * | 12/2000 | Asakura ....................... | 385/24 |
| 2002/0071458 A1 | * | 6/2002 | Iwafuji ......................... | 372/23 |

FOREIGN PATENT DOCUMENTS

| | | |
|---|---|---|
| EP | 1 063 794 A2 | 6/2000 |
| EP | 1 069 658 A1 | 7/2000 |
| JP | 63-45877 | 2/1988 |
| JP | 63-157488 | 6/1988 |
| JP | 63-158927 | 7/1988 |
| JP | 6-196785 | 7/1994 |
| JP | 8-18145 | 1/1996 |
| JP | 9-219554 | 8/1997 |
| JP | 9-298511 | 11/1997 |
| JP | 10-79551 | 3/1998 |
| JP | 10-209546 | 8/1998 |
| JP | 2000-12952 | 1/2000 |
| JP | 2001-7438 | 1/2001 |

OTHER PUBLICATIONS

European Search Report dated Jul. 14, 2003.

* cited by examiner

*Primary Examiner*—Akm Enayet Ullah
(74) *Attorney, Agent, or Firm*—McGinn & Gibb, PLLC

(57) ABSTRACT

The light beam emitted from a variable wavelength light source element 2 is partly directly monitored in a second detector 2 for automatic power control in an APC circuit 14, and is also partly passed through a wavelength filter 5 with the transmittance thereof varying with the wavelength and monitored in A first detector 65. Automatic frequency control is performed in an AFC circuit 15 while detecting wavelength variations by using the filter output and the direct monitored output. Thus, the construction is extremely simplified, while reducing the size and cost.

21 Claims, 11 Drawing Sheets

VARIABLE WAVELENGTH OPTICAL TRANSMITTER OUTPUT CONTROL METHOD THEREFOR AND OPTICAL COMMUNICATION SYSTEM

BACKGROUND OF THE INVENTION

This application claims benefit of Japanese Patent Application No. 2000-378232 filed on Dec. 13, 2000, the contents of which are incorporated by the reference.

The present invention relates to variable wavelength optical transmitter, output control method therefor and optical communication system and, more particularly, to variable wavelength optical transmitter, output control method therefor and optical communication system, in which the output power level and wavelength of a variable wavelength semiconductor laser element is controlled.

Owing to explosive spread of internet systems, there is an increasing demand for transmission capacity increase. This means that not only optical transmission using wavelength of a single semiconductor laser diode but also DWDM (Dense Wavelength Division Multiplex) communication with dense multiplexing of a plurality of wavelengths are becoming more and more important. In the DWDM communication, reduction of the oscillation wavelength interval of the semiconductor laser diode from 100 GHz to 50 GHz or 25 GHz has been demanded. In addition, the number of necessary wavelengths is increasing from 80 to 160, 320 and 640, thus dictating semiconductor laser diodes capable of providing pluralities of wavelengths.

Heretofore, some methods of maintaining extremely narrow wavelength interval, have been proposed as techniques for ensuring semiconductor laser wavelength stability. As an example, according to Japanese Patent Laid-Open No. 10-209546, a forward light beam emitted from a semiconductor laser diode is split by an optical coupler disposed outside a package, and the transmitted and reflected light beams are filtered through interference optical filters and detected by optical detectors, respectively. The oscillation wavelength of the semiconductor laser diode is controlled by using the difference between the two detected light quantities.

To the same end, there are also methods, in which the rearward light beam from a semiconductor laser diode is utilized. In these methods, usually the rearward light beam from a semiconductor laser diode is detected by an optical detector for constant semiconductor laser diode output light beam level control. As for oscillation wavelength variations, such arrangements as for constant temperature control are utilized for suppressing the wavelength variations.

An example of such arrangement is disclosed in Japanese Patent Laid-Open No. 9-219554. In this technique, the temperature of a semiconductor laser diode is controlled for oscillation wavelength control by using two optical filters having transmission characteristics with opposite slopes.

FIG. 14 shows the prior art construction of a semiconductor laser diode wavelength control device disclosed in the Japanese Patent Laid-Open No. 9-219554. In this device, the rearward light beam emitted from a semiconductor laser diode 22 is split by a beam splitter 23 disposed therebehind, and the resultant transmitted and reflected light beams are filtered through wavelength filters 24 and 25 having opposite transmission characteristics and detected by light beam level detectors 26 and 27, respectively.

The light beam detectors 26 and 27 output light beam level detection signals, which are processed in control circuits 28 and 29, whereby the output light beam level and the oscillation wavelength of the semiconductor laser diode 22 are controlled by an LD drive circuit 30 and a temperature control circuit 31. In this construction, the oscillation wavelength of the semiconductor laser diode is controlled by controlling the temperature thereof such as to compensate for the oscillation wavelength deviation based on the difference between the light beam levels detected by the light beam level detectors 26 and 27.

In the above DWDM communication system, the wavelength interval has been shifted from 100 GHz to 50 GHz, and as its light beam transmitter is used, for instance, a variable wavelength light beam source element as shown in FIG. 4. Usually, the wavelength of the semiconductor changes with 10° C. thereof by about 1 nm. With this variable wavelength light beam source element used for the DWDM with wavelength interval of 50 GHz, it is possible to cover five channels (at the time of the 50 GHz wavelength interval) by temperature control of one semiconductor laser diode by ±10° C. Thus, as shown in FIG. 5, by arraying four semiconductor lasers at an interval of 2 nm, it is possible to cover 20 channels with the four semiconductor lasers.

In the prior art disclosed in the above Japanese Patent Laid-Open No. 10-209546 or Japanese Patent Laid-Open No. 9-219544, where the variable wavelength light beam source element having the above construction is used for wavelength stabilization control of semiconductor lasers 351 to 354 constituting the semiconductor laser array shown in FIG. 4, the detectable wavelength range of the wavelength versus permeability characteristic as a characteristic of a wavelength deviation sensor for detecting the wavelength deviation, is narrow, and it is therefore impossible to detect wavelength deviation (i.e., wavelength variation) from each of the wavelengths of a plurality of channels.

Also, the application of the above Japanese Patent Laid-Open No. 10-209546 to a DWDM wavelength stabilization system, poses a problem of giving rise to the optical transmission device size increase in that it is necessary to split the forward light beam with an expensive polarization maintaining coupler for reducing adverse effects of the polarization and also in that when the number of multiplex wavelengths is increased due to necessity of externally using the semiconductor laser module, it is necessary to add wavelength deviation detecting mechanisms corresponding in number to the number of wavelengths, thus requiring an increased space of mounting.

With the construction disclosed in the above Japanese Patent Laid-Open No. 9-219554, it is possible to provide some measure for oscillation wavelength stabilization of the semiconductor laser diode against the secular deterioration thereof. However, to obtain a sufficient received light beam current quantity for control such that the rearward light beam is inputted without being collimated to the optical detector, the optical detector should be disposed in the proximity of the semiconductor laser diode, and it is thus difficult to dispose the filter between these two components. In the variable wavelength light beam source element comprising monolithic integration of a semiconductor laser array, a synthesis unit and a light beam amplifier region is disclosed in Japanese Patent Laid-Open No. 2000-012952, due to the semiconductor laser array it is impossible to receive the rearward light beam uniformly by using a photo-diode. Besides, since the output light beam is adjusted in the light beam or the like by monitoring the forward light beam.

Morover, like the case of the above Japanese Patent Laid-Open No. 10-209546 technique, with an increased number of multiplex wavelengths it is necessary to provide wavelength deviation detecting mechanism corresponding in number to the number of the wavelengths, thus requiring an increased space of mounting and giving rise to the optical transmission device size increase.

SUMMARY OF THE INVENTION

The present invention was made in veiw of the above drawbacks inherent in the prior art semiconductor laser diode wavelength stabalizer, and it has an object of providing a variable wavelength optical transmission device, an output control method therefore and an optical communication system, which permit mounting of a variable wavelength light beam source element wavelength detecting unit in laser package irrespective of increase of the number of multiplex wavelengths, permit oscillation wavelength stabilization and output light beam control of the variable wavelength light beam source element and are suited for wavelength stabilization of semiconductor lasers used in the DWDM system.

According to an aspect of the present invention, there is provided a variable wavelength optical transmitter comprising: a variable wavelength light beam source means capable of oscillating to generate a plurality of light beams of different wavelengths on the basis of external control; a wavelength filter means with the transmittive characteristic thereof changed according to wavelength variations of each of the plurality of light beams of different wavelengths; and a wavelength control means for compensation controlling wavelength variations of the variable wavelength light beam source means on the basis of the output of the wavelength filter means.

According to another aspect of the present invention, there is provided a variable wavelength optical transmitter comprising: a variable wavelength light beam source means capable of oscillating to generate a plurality of light beams of different wavelengths on the basis of external control; a wavelength filter means with the transmittive characteristic thereof changed according to wavelength variations of each of the plurality of light beams of different wavelengths; and a wavelength control means including a first detector for detecting part of the light beam emitted from the variable wavelength light beam source means and passed through the wavelength filter means, a second detector for directly detecting part of the light beam emitted from the variable wavelength light beam source means and a wavelength control circuit for compensation controlling the wavelength variations of the variable wavelength light bream source means on the basis of the detection outputs of the first and second detectors.

The wavelength control circuit compensation controls the wavelength variations on the basis of the ratio between the detection outputs of the first and second detectors. The variable wavelength optical transmitter further comprises a level control means for controlling the output level of the variable wavelength light beam source means on the basis of the detection output of the second detector. The variable wavelength optical transmitter still further comprises a first temperature control means for controlling the oscillation wavelengths of the different wavelength light beams from the variable wavelength light beam source means by controlling the temperature thereof. The wavelength control means includes a second temperature control means for compensation controlling the wavelength variations of the variable wavelength light beam source means by temperature control thereof. The variable wavelength optical light beam source means is mounted on a cooling element temperature controlled by the first and second temperature control means. The wavelength filter means is mounted on the cooling element, and which further comprises a temperature characteristic compensating means for providing the amount of compensation of changes in the transmittive characteristic with temperature of the wavelength filter means due to temperature control of the cooling element to the second temperature control means. At the time of the start the first temperature control means is started to set the wavelength of the variable wavelength light beam source means, and then the second temperature control means is started. The wavelength filter means is an etalon filter element. The variable wavelength light beam means includes a plurality of semiconductor laser elements each being capable of oscillation to generate a plurality of light beams of different wavelength under temperature control, an optical synthesis unit for synthesizing or combining the light beams emitted from the semiconductor laser elements, and an optical amplifier for amplifying the synthesized output of the optical synthesis unit. The wavelength filter mean is disposed such as to receive part of the output light beam from the optical amplifier. The wavelength filter means is disposed such as to receive the rearward light beam emitted form the variable wavelength light beam source means.

According to other aspect of the present invention, there is provided a dense wavelength division multiple optical communication system using the variable wavelength optical transmitter according to the above structure as transmitter.

According to still other aspect of the present invention, there is provided an output control method of a variable wavelength optical transmitter including a variable wavelength light beam source means capable of oscillating to generate a plurality of light beams of different wavelengths on the basis of external control and a wavelength filter means with the transmittive characteristic thereof changed according to wavelength variations of each of the plurality of light beams of different wavelengths, and compensation control is performed for wavelength variations of the variable wavelength light beam source means on the basis of the output of the wavelength filter means, the method comprising: a first detecting step for detecting part of the output light beam emitted from a variable wavelength light beam means and passed through the wavelength filter means; a second detecting step for directly detecting the light beam emitted from the variable wavelength light beam source means; and a wavelength control step for compensation controlling the wavelength variations of the variable wavelength light beam source means on the basis of the detection outputs obtained in the first and second detecting steps.

The wavelength control step compensation controls the wavelength variations on the basis of the ratio between the detection outputs of the first and second steps. The output control method of a variable wavelength optical transmitter further comprises a level control step for controlling the output level of the variable wavelength light beam source means on the basis of the detection output of the second step. The output control method of a variable wavelength optical transmitter still further comprises a first temperature control step for controlling the oscillation wavelengths of the different wavelength light beams from the variable wavelength light beam source means by controlling the temperature thereof. The wavelength control step includes a second temperature control step for compensation controlling the wavelength variations of the variable wavelength light beam source means by temperature control thereof. The wavelength filter means is mounted on the cooling element, and which further comprises a temperature characteristic compensating step for providing the amount of compensation of changes in the transmittive characteristic with temperature of the wavelength filter means due to temperature control of the cooling element to the second temperature step. At the time of the start the first temperature control step is started to set the wavelength of the variable wavelength light beam source means, and then the second temperature control step is started.

Other objects and features will be clarified from the following description with reference to attached drawings.

PREFERRED EMBODIMENTS OF THE INVENTION

Preferred embodiments of the present invention will now be described with reference to the drawings.

Figure 1:
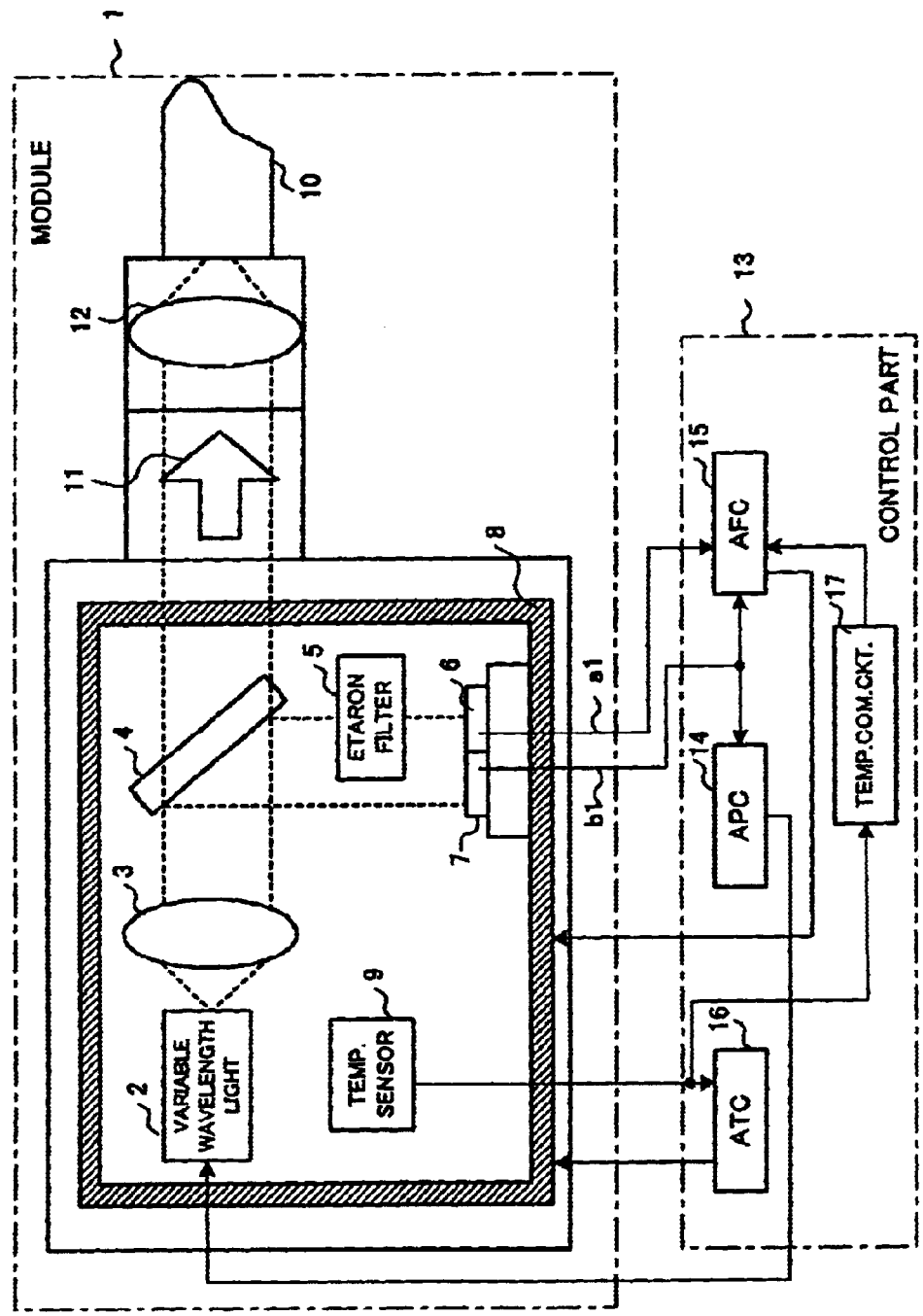
FIG. 1 is a view showing the construction of a first embodiment of the present invention.
Figure 4:
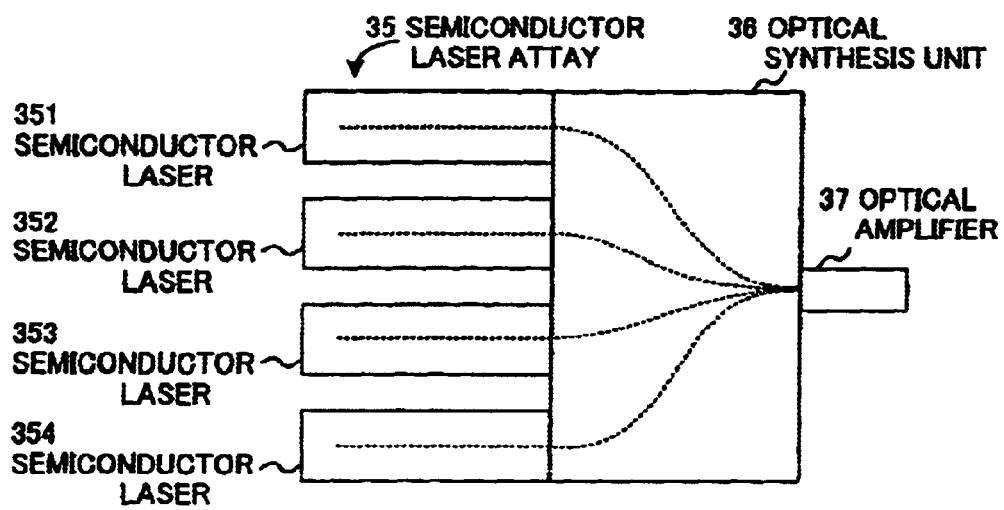
FIG. 4 shows an example of a variable wavelength light beam source element.

FIG. 1 is a view showing the construction of a first embodiment of the present invention. Referring to the Figure, a variable wavelength light beam source element 2, which is used in the DWDM system, has the structure of a semiconductor laser array 35 as shown in FIG. 4, and thus each of the disclosed prior art techniques it can not receive the rearward light beams uniformly. In addition, the output light beam should be adjusted by a light beam amplifier 37. It is thus necessary to control the output light beam or the like by monitoring the forward light beam. Accordingly, as shown in FIG. 1, the output forward light beam from the variable wavelength light beam source element 2 is used for oscillation wavelength stabilization and output light beam control.

Referring to FIG. 1, the first embodiment roughly comprises a module part 1 and a control part 13. The module part 1 includes a variable wavelength light beam source element 2, a lens 3 for converting the output forward light beam emitted from the variable wavelength light beam source element 2 to a parallel beam, a beam splitter 4 for splitting the parallel beam into split beams as a fiber input beam and a wavelength monitoring beam, an etalon filter 5 for receiving as input light beam a part of the split parallel wavelength monitoring beam from the beam splitter 4, a first optical detector 6 for receiving the parallel beam having passed through the etalon filter 5 and converting the received beam to an electric signal, and a second optical detector 7 for directly receiving the split parallel wavelength monitoring beam from he beam splitter 7 and converting the received beam to an electric signal.

The module part 1 further includes an electronic cooling element 8 for controlling the temperature of the variable wavelength light source element 2, a temperature sensor 9, an optical fiber 10, a light beam oscillator 11 for preventing the return light beam of the parallel beam, made parallel by the lens 3, from the optical fiber 10, a lens 12 for coupling the filter input beam from the beam splitter 4 to an optical fiber 10 and the optical fiber 10.

The control part 13 includes an APC (Automatic Power Control) circuit 14 for maintaining a constant output light signal power level of the variable wavelength light signal source element 2, an AFC (Automatic Frequency Control) circuit 15 for controlling the oscillation wavelength of the variable wavelength light signal source element 2, an ATC (Automatic Temperature Control) circuit 15 for maintaining a constant temperature of the variable wavelength light signal source element 2, and a temperature compensation circuit 17 for compensating for the temperature characteristic of the etalon filter 5.

In the variable wavelength light signal source element 2, usually the oscillation wavelength is dependent on the current injected into the semiconductor laser diode part and the temperature thereof, and the AFC is performed according to the current injected into the semiconductor laser diode or the electronic cooling element 8. The APC is performed according to the current injected into the semiconductor laser diode part or the optical amplifier part.

In this embodiment, the forward light signal emitted from the variable wavelength light signal source element 2 is converted by the lens 3 to a parallel beam, which is then split by the beam splitter 4. One split parallel beam, i.e., wavelength monitoring beam, is partly passed through the etalon filter 5 and inputted to the first optical detector 6 for conversion to an electric signal a1, and is also partly directly inputted to the second optical detector 6 for conversion to an electric signal b1.

The etalon filter 5 has its light permeability changed according to the wavelength of the input light beam, and the electric signal a1 obtained as a result of the photo-electric conversion through it contains oscillation wavelength data of the variable wavelength light signal source element. The electric signal b1 is fed to the AFC circuit 15 and the APC circuit 14, and the electric signal a1 is fed to the AFC circuit 15. The AFC (i.e., wavelength variation compensation control) of the variable wavelength light signal source element 2 is performed by comparing the ratio between the electric signals a1L and b1L with a reference value of wavelength control. The APC is performed by comparison of the electric signal b1L with a reference value of output light signal power level control.

At the time of the system start such as when closing the power supply to the module, however, the electric signals a1 and b1 are not yet present. At this time, the ATC (Automatic Temperature Control) thus is performed according to the output signal from the temperature sensor 9 to stabilize the oscillation wavelength of the variable wavelength light signal source element 2 such that the wavelength substantially becomes a desired value, and subsequently the AFC is made. Thereafter, the AFC, the ATC and further the APC are made.

Figure 2:
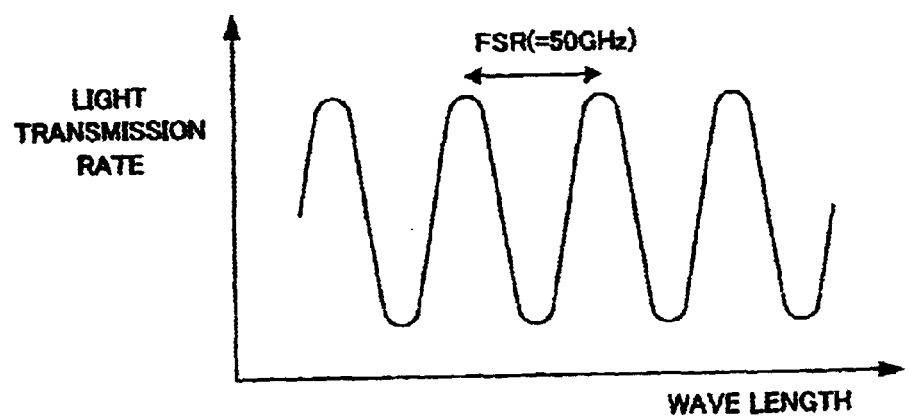
FIG. 2 shows the light transmission rate of the etalon filter plotted against the wavelength.
Figure 3:
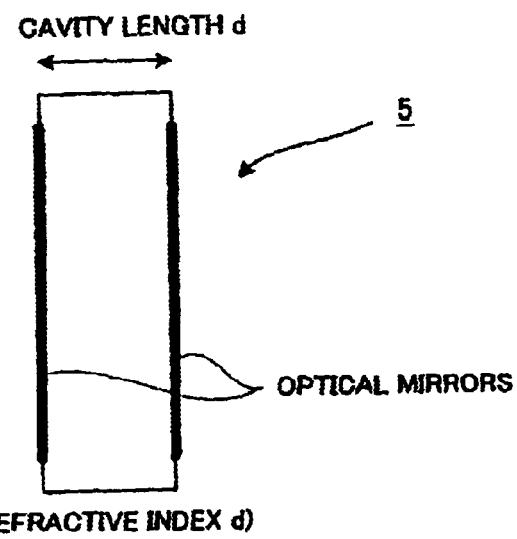
FIG. 3 shows structure of the etalon filter.

As shown in FIG. 3, the etalon filter 5 has two parallel optical mirrors, and its loss wavelength characteristic is provided by interference between these two mirrors. FIG. 2 shows the light transmission rate of the etalon filter 5 plotted against the wavelength. The light transmission rate depends on the phase overlap of two light beams having traveled over different optical path lengths. The phase difference depends on the difference between the optical path lengths covered by the two light beams. A parameter representing the optical path length difference is the product nd of the cavity length d and the refractive index n of the filter shown in FIG. 3.

A change in the product nd causes a change in the transmittive wavelength center of the filter. The transmittance peak interval is called FSR (Free Spectral Range). Denoting the velocity of light by c, when a light means is perpendicularly incident on the filter, the FSR is given as:

$$FSR = c/2nd.$$

The FSR thus can be set by choosing the thickness d and the refractive index n of the filter. The thickness d and the refractive index n are subject to temperature changes, and the center wavelength variation per 1° C. is 1 pm to 10 pm, that is, it is $1/100$ to $1/10$ of the temperature characteristic of the semiconductor laser.

The construction of the example of the variable wavelength light signal source element 2 shown in FIG. 4 is an assumption that the semiconductor laser array 35, the optical synthesis unit 36 and the optical amplifier 37 are monolithically integrated. The wavelength interval of the DWDM which is presently rapidly spreading, is being shifted from 100 GHz to 50 GHz.

Figure 5:
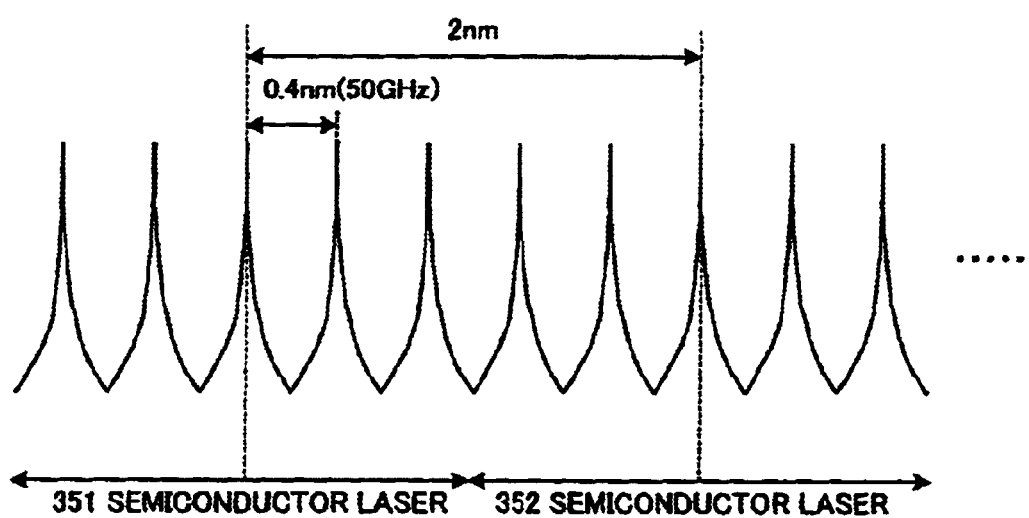
FIG. 5 shows an example of oscillation spectrum of the variable wavelength light beam source element.

Usually, by changing the temperature of the semiconductor laser by 10° C. the oscillation wavelength thereof is changed by about 1 nm. The above variable wavelength light signal source element for the DWDM unit with wavelength interval of 50 GHz, can cover five channels (with wavelength interval of 50 GHz) by temperature controlling one semiconductor laser in a temperature range of ±10° C. As shown in FIG. 5, by arraying the semiconductor lasers at an interval of 2 nm, 20 channels can be covered by using four semiconductor lasers, and 40 channels can be covered by using eight semiconductor lasers.

Wavelength stabilization control by using the variable wavelength light signal source element 2, may be made so long as the same transmittance can be detected periodically for each channel by using etalon filter 5 with an FSR of 50 GHz. For the wavelength control of the variable wavelength light signal source element 2, however, temperature control in a range of ±10° C. is necessary, and this means that the control is effected by the transmittance temperature characteristic of the etalon filter 5 with respect to the wavelength.

To preclude the effects of the temperature characteristic of the etalon filter 5, the temperature compensation circuit 17 shown in FIG. 1 is used to input the compensation signal from the temperature compensation circuit 17 to the AFC circuit 15.

Figure 6:
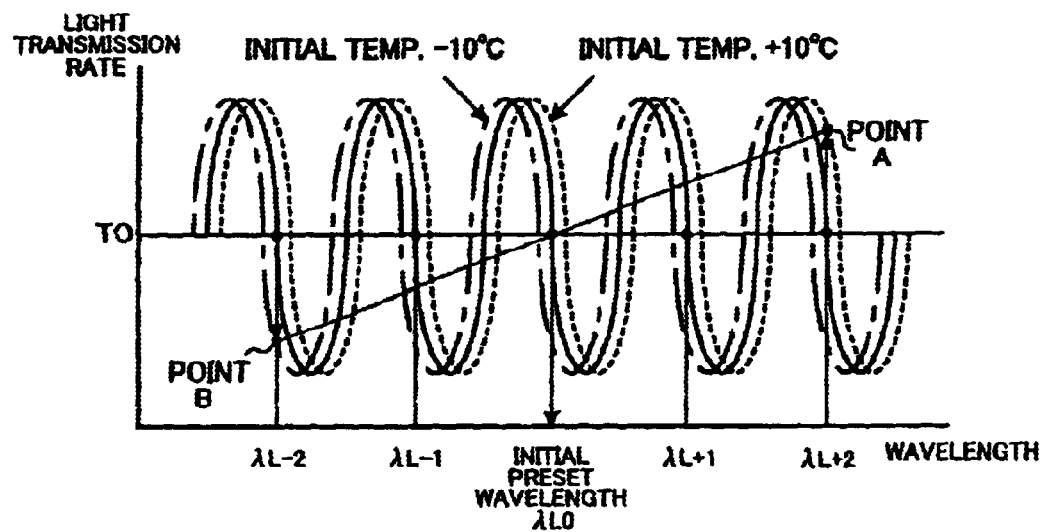
FIG. 6 shows transmittance characteristics of the variable wavelength light beam source element.

FIG. 6 shows transmittance characteristics inclusive of the temperature characteristics of the etalon filter 5. In the Figure, it is assumed that one semiconductor laser in the semiconductor laser array of the variable wavelength light signal source element 2 is being driven. In this case, by making temperature control of the element in a range of ±10° C. it is possible to cover five channels (at wavelength interval of 50 GHz). It is also assumed that the etalon filter 5 is preset such that the initial preset wavelength λL0 is located at the center of the wavelength range, in which the transmittance of the etalon filter 5 increases or decreases monotonously. The transmittance at this time is denoted by T0.

In wavelength range in the neighborhood of λL0, the transmittance is less than T0 with an oscillation wavelength greater than λL0 and is greater than T0 with an oscillation wavelength less than λL0. The AFC of the variable wavelength light signal source element 2 is performed such that at the time of T0 the ratio a1L/b1L between the currents a1L and b1L from the first and second optical detectors 6 and 7 has a predetermined reference value.

The APC of the output light signal power level also can be performed by controlling the current injected into the optical amplifier 37 such as to make the current b1L from the second optical detector 7 is constant.

Figure 7:
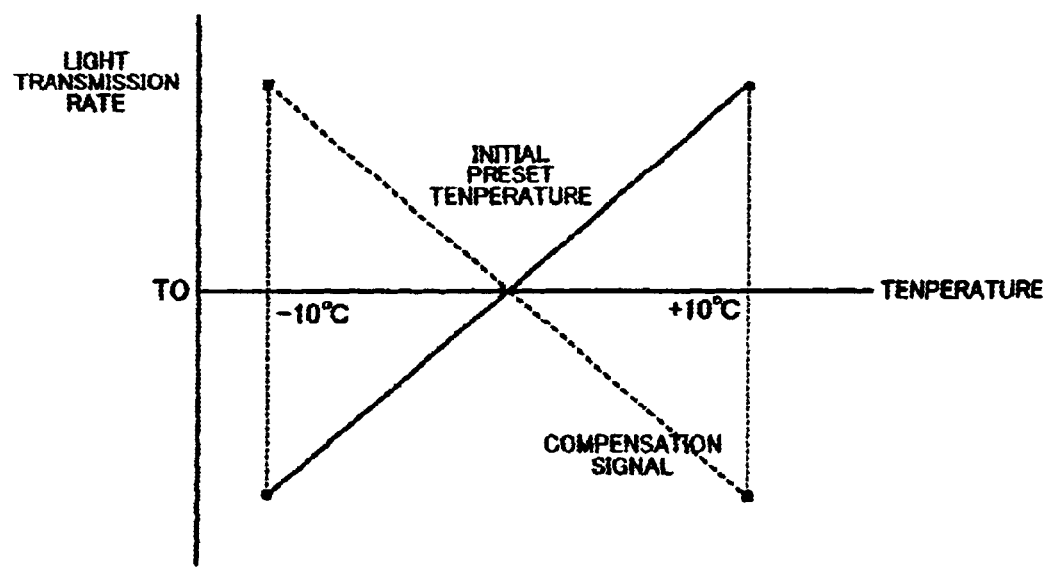
FIG. 7 shows a drawing for explaining the temperature compensation signal.

By temperature controlling the variable wavelength light signal source element 2 to change the oscillation wavelength from λL0 to λL+2 spaced apart by 100 GHz, i.e., roughly over two valleys, the transmittance is shifted to point A in FIG. 6 due to the temperature characteristic of the etalon filter 5. By further changing the oscillation wavelength by λL+2, the transmittance is further shifted to point B. The temperature characteristic of the etalon filter 5 is changed linearly. Thus, as shown in FIG. 7, a characteristic shown by the opposite straight plot (i.e., dashed plot) to the characteristic shown by the straight plot (i.e., solid plot) connecting the points A and B in FIG. 6 is calculated in the temperature compensation circuit 17, and the calculated data is inputted as a compensation signal to the AFC circuit 15 for wavelength stabilization control of the variable wavelength light signal source element 2 at the time of wavelength variations. It is thus possible to dispose the etalon filter and the variable wavelength light signal source element on the same electronic cooling element, thus reducing the number of component and also the size of the module.

Figure 8:
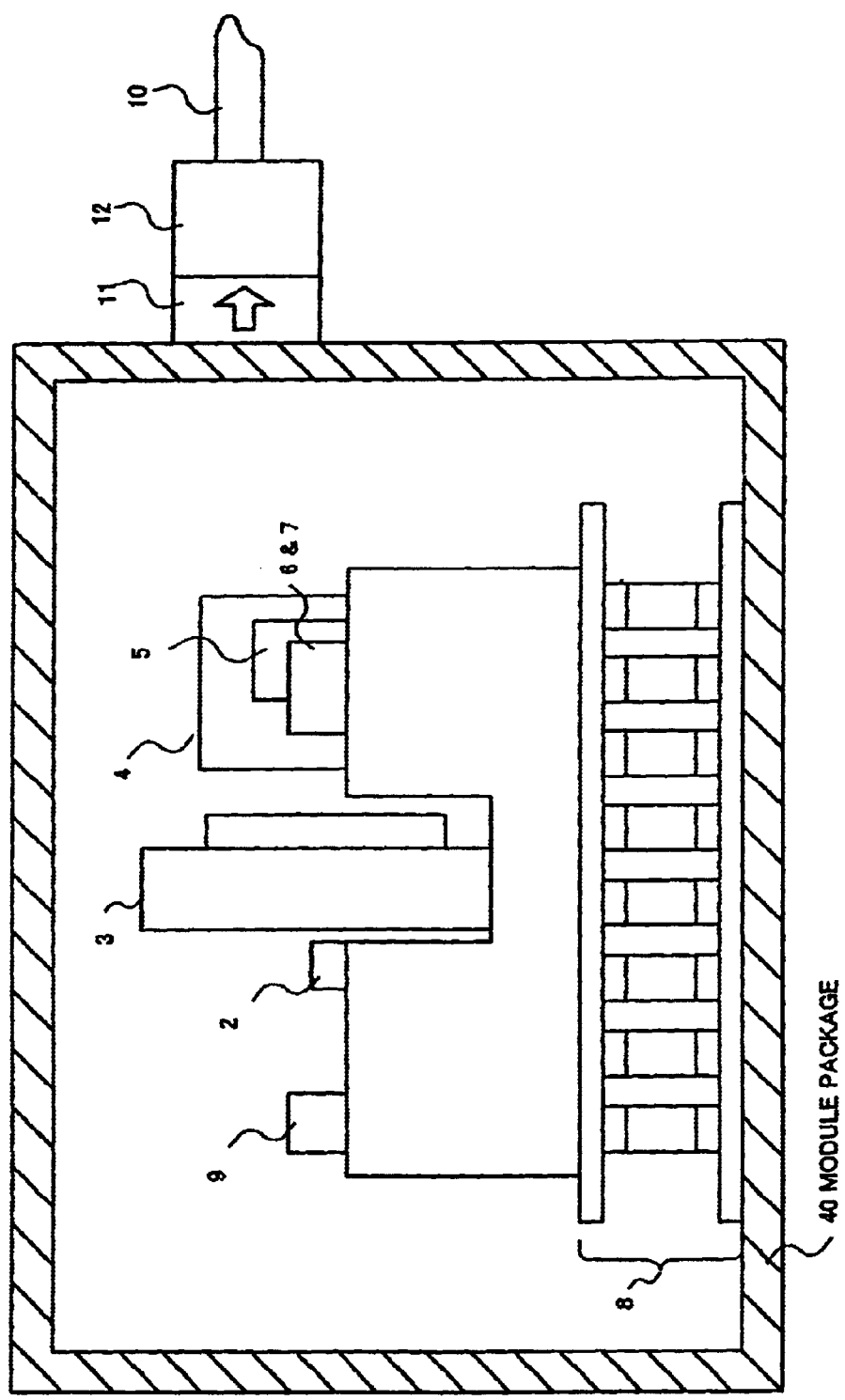
FIG. 8 shows a concrete structure of the module part 1 shown in FIG. 1.

While FIG. 1 shows the embodiment in a functional block diagram, FIG. 8 schematically shows a specific example of the module part 1 shown in FIG. 1. In FIG. 8, parts like those shown in FIG. 1 are designated by like reference numerals. As shown, the lens 3, the beam splitter 4, the first and second optical detectors 6 and 7 and the temperature sensor 9 as well as the variable wavelength light signal source element 21 and the etalon filter 5 are all disposed on the same electronic cooling element 8. Reference numeral 40 designates a module package.

Figure 9:
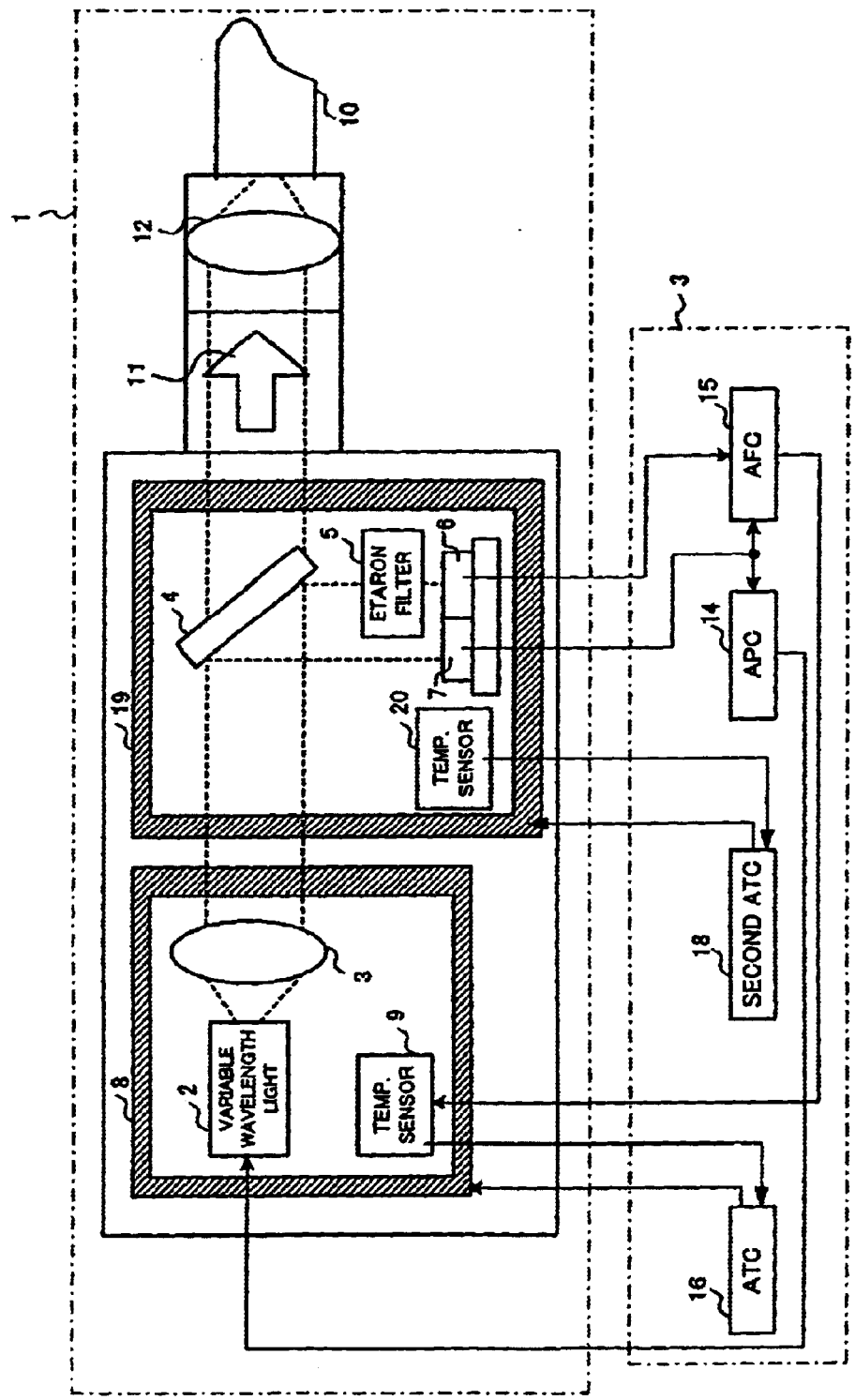
FIG. 9 is a view showing the construction of a second embodiment of the present invention.

A second embodiment will now be described. FIG. 9 shows the construction of the second embodiment. In FIG. 9, parts like those in FIG. 1 are designated by like reference numerals. In the previous first embodiment, the variable wavelength light signal source element 2 and the etalon filter 5 are disposed on the same substrate or the same electronic cooling element. In this embodiment, as shown in FIG. 9, the variable wavelength light signal source element 2 and the etalon filter 5 are mounted on separate electronic cooling elements 8 and 19, respectively.

While in the first embodiment the deviation of the AFC signal due to the temperature characteristic of the etalon filter 5 is compensated for by the temperature compensation circuit 17, the separate temperature control of the variable wavelength light signal source element 2 and the temperature compensation circuit 17, requires a second ATC circuit 18 a second electronic cooling element 19 and a second temperature sensor 20 in lieu of the temperature compensation circuit 17. On the merit side, however, the temperature characteristic of the etalon filter 5 need not be taken into considerations, and it is thus possible to alleviate the mounting tolerance of the etalon filter 5 and reduce the number of control steps.

In addition, with the AFC independent from the temperature compensation circuit 17, highly accurate wavelength stabilization is obtainable. In the following control method, instead of the temperature compensation circuit the second ATC circuit 18 for controlling the second electronic cooling element is provided for constant temperature control of the etalon filter 5. The AFC and APC are substantially the same as in the first embodiment, and their descriptions are not given here.

Figure 10:
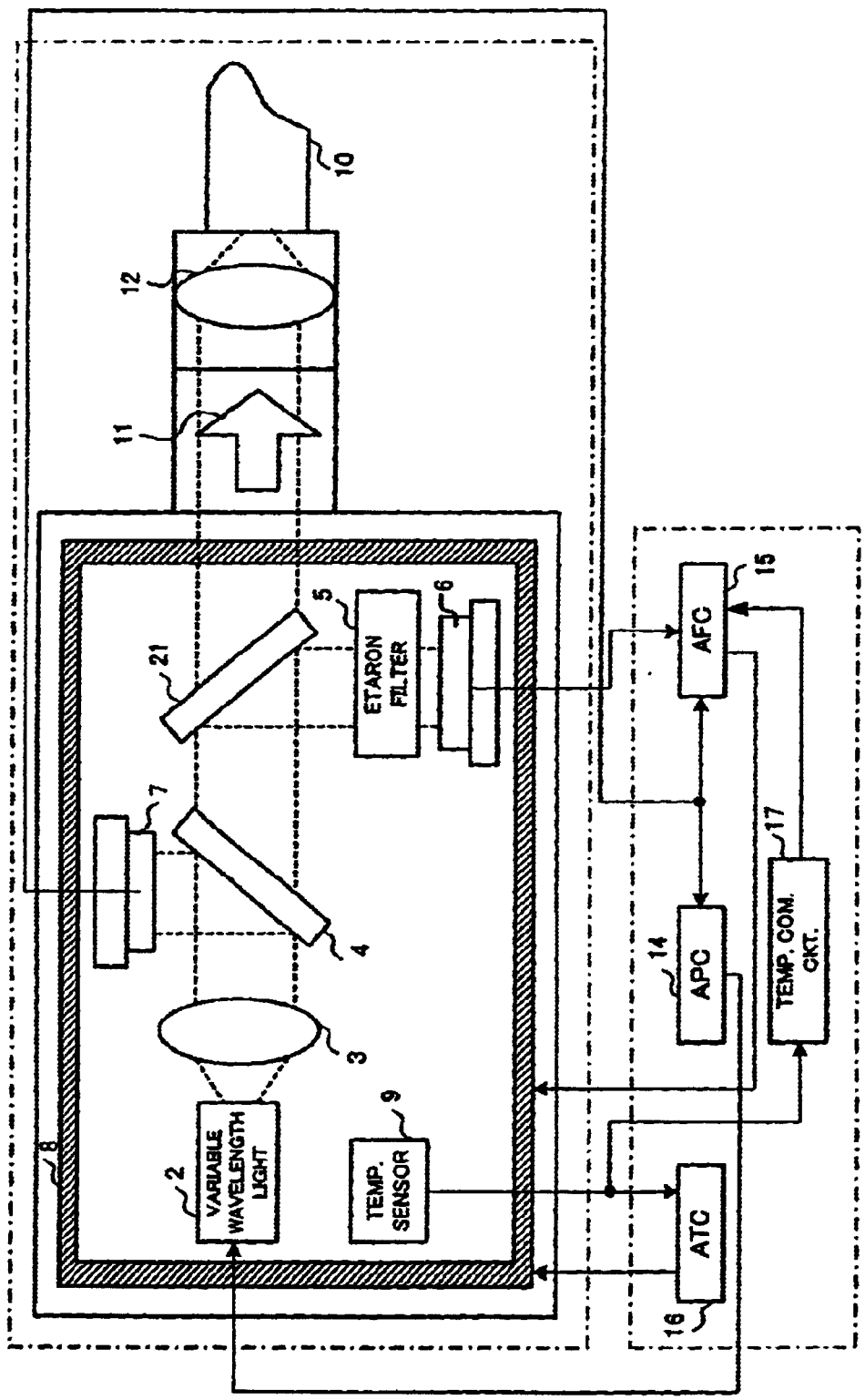
FIG. 10 is a view showing the construction of a third embodiment of the present invention.

A third embodiment will now be described. FIG. 10 shows the construction of the third embodiment. In FIG. 10, parts like those in FIGS. 1 and 9 are designated by like reference numerals. In this embodiment, as shown in FIG. 10, beam splitters 4 and 21 are disposed for splitting the forward light beam emitted from the variable wavelength light signal source element 2. The split light beam from the beam splitter 4 is received by the second optical detector 7, and the split light beam from the other beam splitter 21 is filtered through the etalon filter 5 and then received for detection by the first detector 6. By using the two beam splitters 4 and 21, it is possible to alleviate the mounting tolerance of the optical detectors and suppress wavelength deviation in the optical path.

The control method in this embodiment is the same as in the first embodiment, and its description is not given here. It will be obvious that the same effects are obtainable by using a trapezoidal prism in lieu of the two beam splitters 4 and 21. The actual mechanical mounting status of the various components is the same as shown in FIG. 8.

A fourth embodiment will now be described. In the above first embodiment, the oscillation wavelength should be present in the linear part of the transmittive characteristic of the etalon filter even when temperature controlling the variable wavelength light signal source element 2 for compensating for the temperature characteristic of the etalon filter. This embodiment has a construction permitting the compensation even when the oscillation wavelength is present in a non-linear part of the characteristic of the etalon filter 5. When the points A and B shown in FIG. 6 are present in the non-linear region, the following method is used.

Figure 11:
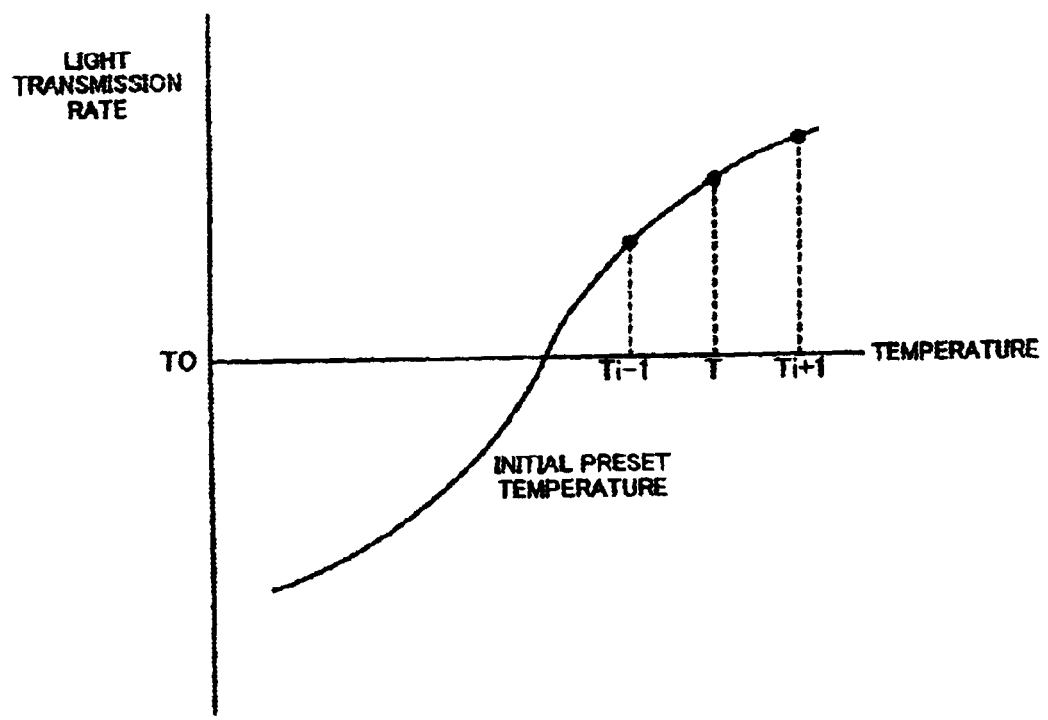
FIG. 11 is a view showing the construction of a fourth embodiment of the present invention.

As shown in FIG. 11, two temperature points around temperature point T are labeled by Ti−1 and Ti+1, and analog-to-digital conversion values obtained from the detected voltage values from the first optical detector in correspondence to the individual temperature points are denoted by Y(T), Y(Ti−1) and Y(Ti+1). These values are written in a ROM or the like. Computation is then performed on the written values to obtain a compensation signal, which is inputted to the AFC circuit for the wavelength control.

The compensation signal used is given as:

$$-(Y(Ti-1)+(Y(Ti+1)-Y(Ti-1)\times(T-Ti-1)/((Ti+1)-(Ti-1))).$$

Thus, by using this compensation signal accurate wavelength control is obtainable even when the temperature characteristic of the etalon filter 5 is large or when the temperature control range of the variable wavelength light signal source element 2 is excessive.

In the above individual embodiments, the variable wavelength light signal source element 2 may be one in which optical modulator is coupled to the output side of an optical amplifier, or one in which a DBR (Distributed Bragg Reflector) laser, a cascade type DFB (Distributed Feedback) laser and an optical amplifier are integrated.

Figure 12:
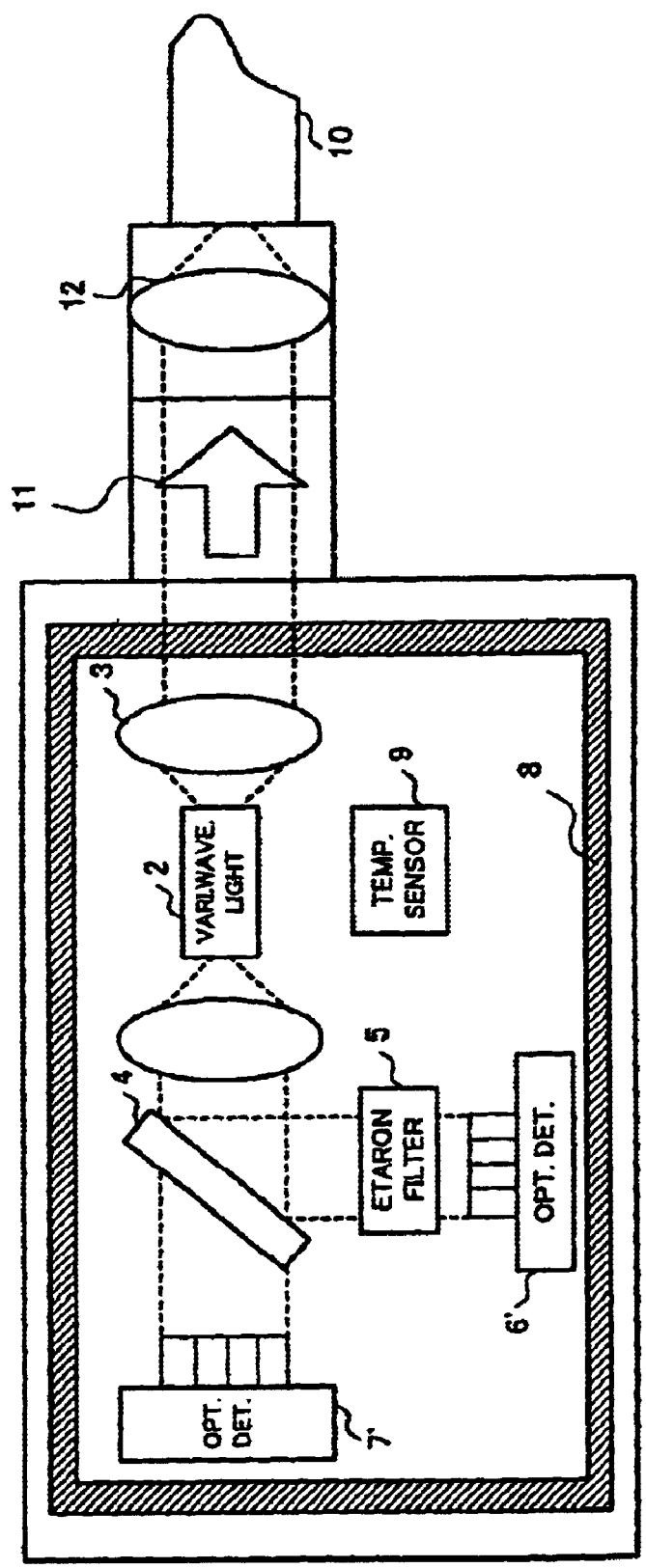
FIG. 12 shows a construction of the module part utilizing the rearward light of the variable wavelength light source element.

It is not limitative that the variable wavelength light signal source element 2 has the construction as shown in FIG. 4. Also, the light beam to be monitored is not limited to the forward light beam emitted from the element, but it may also be a rearward light beam therefrom. FIG. 12 shows a construction in the latter case. In this case, a first and a second optical detector 6' and 7' are disposed together with the beam splitter 4 on the rear side of the variable wavelength light signal source element 2 for receiving and detecting the rearward light signal emitted therefrom. The first and second optical detectors 6' and 7' each have an array structure such that the rearward light beam emitted from each of the semiconductor lasers 351 to 354 in the semiconductor laser array 35 shown in FIG. 4 can be received and detected.

As an application of the device in each of the above embodiments of the present invention, a wavelength multiplexed optical transmission system can be constructed by using a plurality of devices as shown above in an optical transmission station such that wavelengths of individual light signals are close to one another and highly accurately controlled. Also, the individual devices may be utilized as back-up light signal source capable of covering multiple wavelengths. Specifically, the wavelength multiplexed optical transmission system using the variable wavelength optical transmitter according to the present invention comprises an optical transmitting station, an optical receiving station and an optical transmission line interconnecting the optical transmitter and receiver. On the transmission line, an optical amplifier for amplifying an attenuated signal is provided. In this system, a plurality of light signals of different wavelengths are transmitted and received between the optical transmitting and receiving stations.

The optical transmitter is the variable wavelength optical transmitter with a built-in wavelength monitor according to the present invention, and includes a plurality of optical transmitters for outputting signal light beams of different wavelengths from optical waveguides (i.e., optical fibers) and optical synthesis unit for wavelength multiplexing the signal light beams. The optical receiving station includes optical receivers for receiving the signal light beams.

Figure 13:
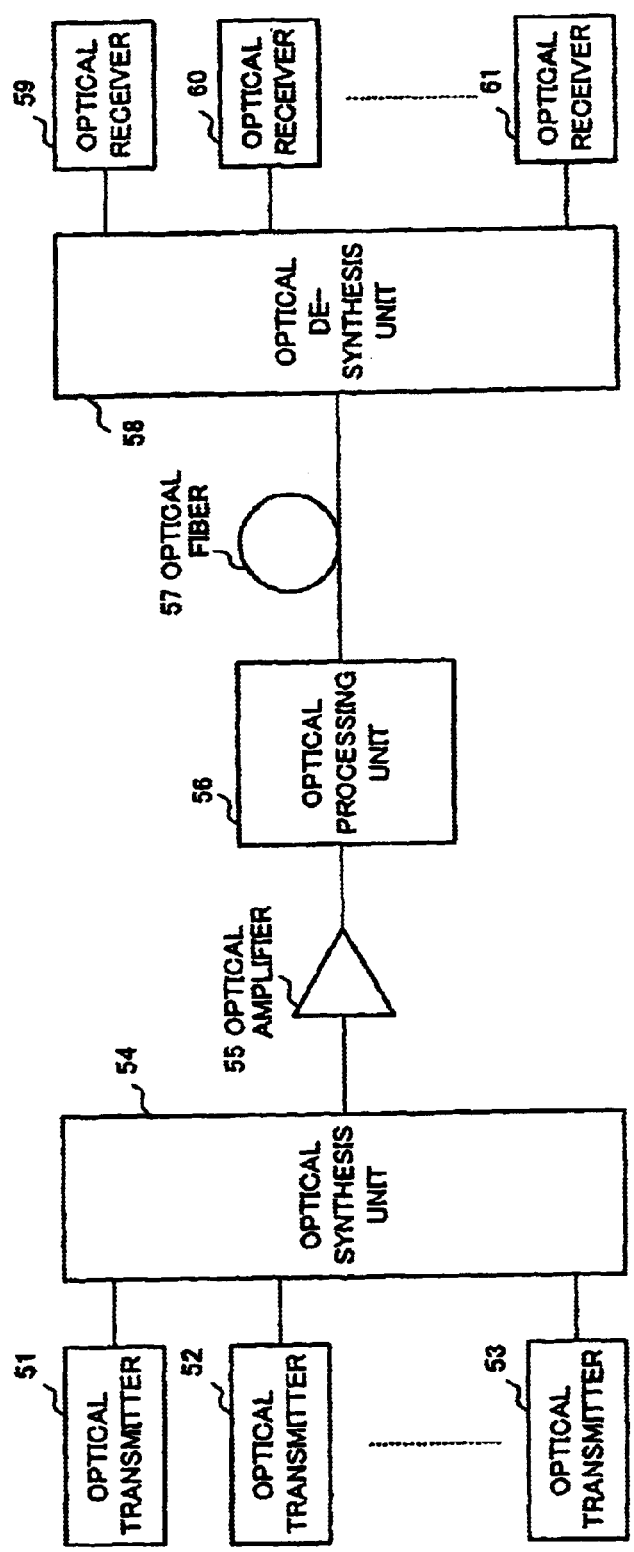
FIG. 13 shows a block diagram of optical system based on DWDM system according to an application of the present invention.
Figure 14:
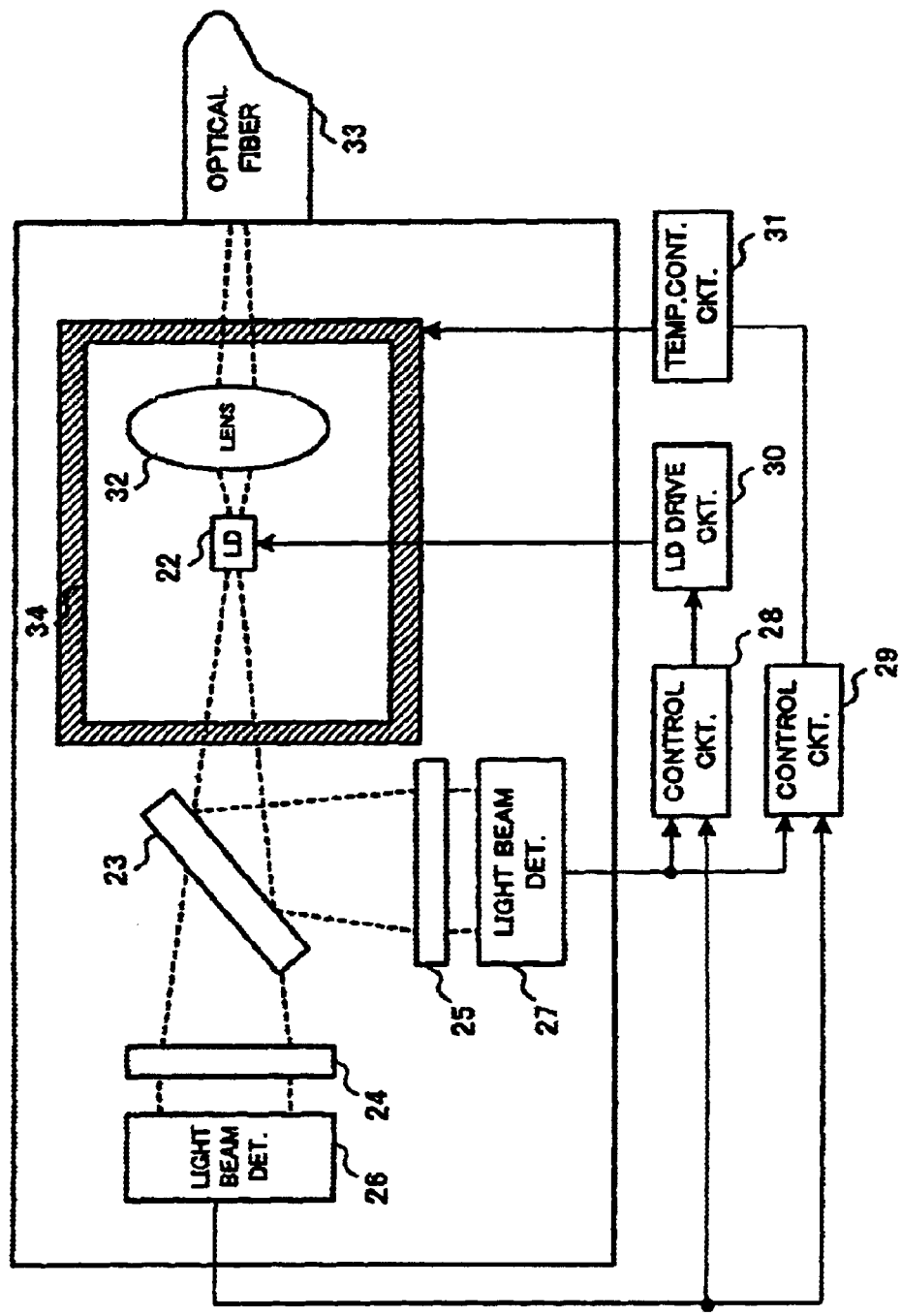
FIG. 14 shows a prior art structure of variable wavelength control device.

FIG. 13 shows an example of such system construction. Referring to the Figure, optical transmitters 51 to 53 are those as described above according to the present invention. From the output light signals transmitted from these optical transmitters, an optical synthesis unit 54 generates wavelength multiplexed signal, which is amplified by an optical amplifier 55 and fed to an optical processing unit 56. In the optical processing unit 56, such processes as add/drop process of light signals and process of multiplexing with a wavelength multiplexed signal from a different optical amplifier are performed. The output light signal from the optical processing unit 56 is transmitted via an optical fiber 57 to an optical de-synthesis unit 58 for de-synthesis to recover the light signals, which are received in optical receivers 59 to 61.

As has been described in the foregoing, according to the present invention the light signal (either forward or rearward) from the variable wavelength light source element is partly directly monitored for the APC, and is also partly monitored through a wavelength filter, which provides different transmittance values for a plurality of wavelengths, and the AFC is performed while detecting wavelength variations by using the filter output and direct monitor output. Thus, the construction is extremely simplified irrespective of increase of the number of multiplexed wavelengths, and it is possible to reduce size and cost of the device.

For further simplifying the construction, the filter is disposed on the cooling element for temperature control, i.e., wavelength control, of the variable wavelength light source element. In this case, a compensating means for inversely compensating the wavelength versus transmittive characteristic of the filter for temperature variations, and further size reduction is obtainable. The compensating means can be dispensed with by independently temperature controlling the variable wavelength light source element and the filter.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A variable wavelength optical transmitter comprising:
    a variable wavelength light beam source means capable of oscillating to generate a plurality of light beams of different wavelengths on the basis of external control;
    a wavelength filter means with the transmittive characteristic thereof changed according to wavelength variations of each of the plurality of light beams of different wavelengths; and
    a wavelength control means for compensation controlling wavelength variations of the variable wavelength light beam source means on the basis of the output of the wavelength filter means.

2. A variable wavelength optical transmitter comprising:
    a variable wavelength light beam source means capable of oscillating to generate a plurality of light beams of different wavelengths on the basis of external control;
    a wavelength filter means with the transmittive characteristic thereof changed according to wavelength variations of each of the plurality of light beams of different wavelengths; and
    a wavelength control means including a first detector for detecting part of the light beam emitted from the variable wavelength light beam source means and passed through the wavelength filter means, a second detector for directly detecting part of the light beam emitted from the variable wavelength light beam source means and a wavelength control circuit for compensation controlling the wavelength variations of the variable wavelength light beam source means on the basis of the detection outputs of the first and second detectors.

3. The variable wavelength optical transmitter according to claim 2, wherein the wavelength control circuit compensation controls the wavelength variations on the basis of the ratio between the detection outputs of the first and second detectors.

4. The variable wavelength optical transmitter according to claim 2, which further comprises a level control means for controlling the output level of the variable wavelength light beam source means on the basis of the detection output of the second detector.

5. The variable wavelength optical transmitter according to claim 1, which further comprises a first temperature control means for controlling the oscillation wavelengths of the different wavelength light beams from the variable wavelength light beam source means by controlling the temperature thereof.

6. The variable wavelength optical transmitter according to claim 5, wherein the wavelength control means includes a second temperature control means for compensation controlling the wavelength variations of the variable wavelength light beam source means by temperature control thereof.

7. The variable wavelength optical transmitter according to claim 6, wherein the variable wavelength optical light beam source means is mounted on a cooling element temperature controlled by the first and second temperature control means.

8. the variable wavelength optical communication according to claim 7, in which the wavelength filter means is mounted on the cooling element, and which further comprises a temperature characteristic compensating means for providing the amount of compensation of changes in the transmittive characteristic with temperature of the wavelength filter means due to temperature control of the cooling element to the second temperature control means.

9. The variable wavelength light beam optical transmitter according to claim 5, wherein, at the time of the start the first temperature control means is started to set the wavelength of the variable wavelength light beam source means, and then the second temperature control means is started.

10. The variable wavelength optical transmitter according to claim 1, wherein the wavelength filter means comprises an etalon filter element.

11. The variable wavelength optical transmitter according to claim 1, wherein the variable wavelength light beam means includes a plurality of semiconductor laser elements each being capable of oscillation to generate a plurality of light beams of different wavelength under temperature control, an optical synthesis unit for synthesizing or combining the light beams emitted from the semiconductor laser elements, and an optical amplifier for amplifying the synthesized output of the optical synthesis unit.

12. The variable wavelength optical transmitter according to claim 1, wherein the wavelength filter mean is disposed such as to receive part of the output light beam from the optical amplifier.

13. The variable wavelength optical transmitter according to claim 1, wherein the wavelength filter means is disposed such as to receive the rearward light beam emitted from the variable wavelength light beam source means.

14. A dense wavelength division multiple optical communication system using the vanable wavelength optical transmitter according to claim 1 as transmitter.

15. An output control method of a variable wavelength optical transmitter including a variable wavelength light beam source means capable of oscillating to generate a plurality of light beams of different wavelengths on the basis of external control and a wavelength filter means with the transmittive characteristic thereof changed according to wavelength variations of each of the plurality of light beams of different wavelengths, and compensation control is performed for wavelength variations of the variable wavelength light beam source means on the basis of the output of the wavelength filter means, the method comprising:
    a first detecting step for detecting part of the output light beam emitted from a variable wavelength light beam means and passed through the wavelength filter means;
    a second detecting step for directly detecting the light beam emitted from the variable wavelength light beam source means; and a wavelength control step for compensation controlling the wavelength variations of the variable wavelength light beam source means on the basis of the detection outputs obtained in the first and second detecting steps.

16. The output control method of a variable wavelength optical transmitter according to claim 15, wherein the wavelength control step compensation controls the wavelength variations on the basis of the ratio between the detection outputs of the first and second steps.

17. The output control method of a variable wavelength optical transmitter according to claim 15, which further comprises a level control step for controlling the output level of the variable wavelength light beam source means on the basis of the detection output of the second step.

18. The output control method of a variable wavelength optical transmitter according to claim 14, which further comprises a first temperature control step for controlling the oscillation wavelengths of the different wavelength light beams from the variable wavelength light beam source means by controlling the temperature thereof.

19. The output control method of a variable wavelength optical transmitter according to claim 18, wherein the wavelength control step includes a second temperature control step for compensation controlling the wavelength variations of the variable wavelength light beam source means by temperature control thereof.

20. The output control method of a variable wavelength optical transmitter according to claim 19, wherein the wavelength filter means is mounted on the cooling element, and which further comprises a temperature characteristic compensating step for providing the amount of compensation of changes in the transmittive characteristic with temperature of the wavelength filter means due to temperature control of the cooling element to the second temperature step.

21. The output control method of a variable wavelength optical transmitter according to claim 19, wherein, at the time of the start the first temperature control step is started to set the wavelength of the variable wavelength light beam source means, and then the second temperature control step is started.

* * * * *